United States Patent
Rombach et al.

(10) Patent No.: US 9,588,154 B2
(45) Date of Patent: Mar. 7, 2017

(54) METHOD FOR OPERATING A MICROCOMPUTER APPARATUS

(71) Applicant: Robert Bosch GmbH, Stuttgart (DE)

(72) Inventors: Daniel Rombach, Metzingen (DE);
Kamil Pogorzelski, Stuttgart (DE);
Jacek Wiszniewski,
Leinfelden-Echterdingen (DE); Marcus Prantner, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 272 days.

(21) Appl. No.: 14/315,429

(22) Filed: Jun. 26, 2014

(65) Prior Publication Data

US 2015/0002133 A1    Jan. 1, 2015

(30) Foreign Application Priority Data

Jun. 27, 2013  (DE) .................. 10 2013 212 379

(51) Int. Cl.
*G01R 19/165* (2006.01)
*B25F 5/00* (2006.01)

(52) U.S. Cl.
CPC .......... *G01R 19/165* (2013.01); *B25F 5/00* (2013.01); *G01R 19/16533* (2013.01); *G01R 19/16576* (2013.01)

(58) Field of Classification Search
CPC .......... G01R 19/165; G01R 19/16533; G01R 19/16576
USPC ....................................... 324/76.11
See application file for complete search history.

(56) References Cited

U.S. PATENT DOCUMENTS

| | | | | |
|---|---|---|---|---|
| 5,689,460 A | * | 11/1997 | Ooishi | G11C 5/143 327/530 |
| 7,504,807 B2 | * | 3/2009 | Kataoka | H02M 3/158 307/85 |
| 2005/0184984 A1 | * | 8/2005 | Kim | G06F 1/305 345/211 |
| 2008/0012604 A1 | * | 1/2008 | Morishita | G06F 1/28 327/78 |
| 2011/0115526 A1 | * | 5/2011 | Ouchi | H03K 3/02337 327/74 |
| 2011/0238345 A1 | * | 9/2011 | Gauthier | G01R 31/002 702/64 |

(Continued)

FOREIGN PATENT DOCUMENTS

DE        102 97 753 B4    7/2011

OTHER PUBLICATIONS

Perme, Tom; AN1072, Measuring VDD Using the 0.6V Reference; Microchip Technology Inc.; 2007; 10 Pages.

*Primary Examiner* — Robert P Alejnikov, Jr.
(74) *Attorney, Agent, or Firm* — Maginot, Moore & Beck LLP

(57) ABSTRACT

A method for operating a microcomputer apparatus includes provisioning an electrical reference voltage that is independent of an electrical supply voltage, continuously comparing a defined level of the electrical reference voltage with the electrical supply voltage, and performing a defined operation with the microcomputer apparatus for at least one defined ratio between the defined level of the electrical reference voltage and the electrical supply voltage. The provisioning and the continuous comparing involves using a functional module of the microcomputer apparatus.

9 Claims, 1 Drawing Sheet

(56) References Cited

U.S. PATENT DOCUMENTS

2012/0187985 A1* 7/2012 Færevaag ............. H03K 17/22
 327/143
2012/0281491 A1* 11/2012 Dao ................. G01R 19/16519
 365/226

* cited by examiner

METHOD FOR OPERATING A MICROCOMPUTER APPARATUS

This application claims priority under 35 U.S.C. §119 to patent application no. DE 10 2013 212 379.5, filed on Jun. 27, 2013 in Germany, the disclosure of which is incorporated herein by reference in its entirety.

The disclosure relates to a method for operating a microcomputer apparatus. The disclosure also relates to an electrical apparatus with a mains power supply.

BACKGROUND

For electrical appliances that are supplied with an electrical AC voltage by means of forward phase control, the synchronization signal is a digital map of the AC voltage signal, and is therefore an important signal because it prescribes a clock for generating and processing further signals of the electrical appliances.

It is already known that electronics for such appliances can be put into a safe state when the electrical supply voltage is too low. For this purpose, it is possible to use what is known as a brownout module, for example, which is integrated in some microcontrollers. A disadvantage is that said modules are usually not freely configurable, however, which means that a threshold voltage to be monitored usually cannot be adjusted, can be adjusted only very coarsely or can be adjusted on the basis of the power supply using said modules. They normally switch the microcontroller to a reset state, as a result of which the microcontroller is then no longer able to react in a useful manner.

A circuit that triggers a reset for the microcontroller at the master clear connection is also known. Said circuit is implemented externally and therefore means space requirement and cost.

An internal module for a microcontroller is also known that implements monitoring from an electrical supply voltage for the microcontroller. By way of example, such a module is described in application note AN1072 "Measuring $V_{DD}$ Using the 0.6 V Reference" from Microchip Technology Inc.

SUMMARY

It is an object of the present disclosure to provide an improved method for operating an electrical apparatus.

According to a first aspect, the object is achieved by a method for operating a microcomputer apparatus having the steps of:
a) provision of an electrical reference voltage that is independent of an electrical supply voltage;
b) continuous comparison of a defined level of the reference voltage with the electrical supply voltage; and
c) performance of a defined operation by the microcomputer apparatus for at least one defined ratio between the level of the reference voltage and the supply voltage, wherein the performance of steps a) and b) involves the use of a functional module of the microcomputer apparatus.

The fact that the reference voltage is essentially independent of the supply voltage does not change the reference voltage when the supply voltage changes. Since the supply voltage for the microcomputer apparatus is often also the electrical supply voltage for peripheral elements and assemblies of the electrical apparatus, however, an electrical voltage level that is at least required for proper functionality can be defined for said elements in advance.

Advantageously, this allows the provision of a defined mode for peripheral elements by means of voltage monitoring that is provided by the microcomputer apparatus. In this way, the internal functional module of the microcomputer apparatus provides useful functionality for the voltage monitoring according to the disclosure.

According to a second aspect, the object is achieved by means of an electrical apparatus with a mains power supply, having a microcomputer apparatus, wherein the electrical apparatus can be switched to a defined state by means of the method according to the disclosure that is carried out by the microcomputer apparatus.

Preferred embodiments of the method according to the disclosure and the electrical apparatus according to the disclosure are the subject matter of subclaims.

In a preferred embodiment of the method according to the disclosure, the defined operation is performed when the supply voltage is below a defined threshold value. In this way, a defined action can be prompted by the microcomputer apparatus in response to a drop below a limit-value voltage value, as a result of which unforeseeable effects owing to the excessively low voltage value can be avoided.

In a further advantageous development of the method according to the disclosure, the microcomputer apparatus outputs a control signal to an electronic device. This allows the electronic device to be actuated in a defined manner in the event of a drop below an electrical voltage level.

A further preferred embodiment of the electrical apparatus according to the disclosure is distinguished in that the defined state is a standby state. As a result, in the event of a drop below a predefined threshold value for the electrical supply voltage, a useful operating state can be implemented in which the electrical apparatus is taken out of a normal mode in a defined manner and can easily be returned thereto by means of the microcomputer apparatus.

In a further preferred embodiment of the electrical apparatus according to the disclosure, it also has an electronic device, wherein a threshold value for the supply voltage for the microcomputer apparatus is designed on the basis of a requirement of an electronic device in respect of the power supply therefor. In this way, the supply voltage advantageously matches an energy requirement of the electronic device. This allows selection of the electronic device or function group that, as "weakest element" to some extent, is the most reliant on exact observance of a prescribed electrical power supply level.

In a further preferred embodiment of the apparatus, the electronic device is provided for the purpose of producing a synchronization signal. In this way, a type of electronic device that has particularly unforeseeable influences on the electronics as a whole in the event of improper functioning is deactivated. Hence, this advantageously assists essentially continuous, proper and defined operation of the electrical apparatus, regardless of any fluctuations in the electrical supply voltage.

In further preferred embodiments of the apparatus according to the disclosure, the threshold value and/or a reference voltage can be adjusted in a defined manner. In this way, it is a simple matter to provide different modes of operation for the apparatus according to the disclosure.

In a further preferred embodiment of the electrical apparatus according to the disclosure, the electrical apparatus is an electric tool. This implements a particularly useful instance of application of the electrical apparatus because this type of electrical apparatus usually contains a large number of peripheral electronic elements and assemblies that require a sufficiently high electrical voltage level for the overall operation of the electric tool.

The disclosure is described in detail below with further features and advantages with reference to two figures. In this case, all of the described or presented features, independently or in any combination, form the subject matter of the disclosure, regardless of their summarization in the patent claims or the referencing therein, and regardless of their wording or presentation in the description and in the figures. The figures are above all intended to clarify the principles that are essential to the disclosure.

DETAILED DESCRIPTION

Figure 1:
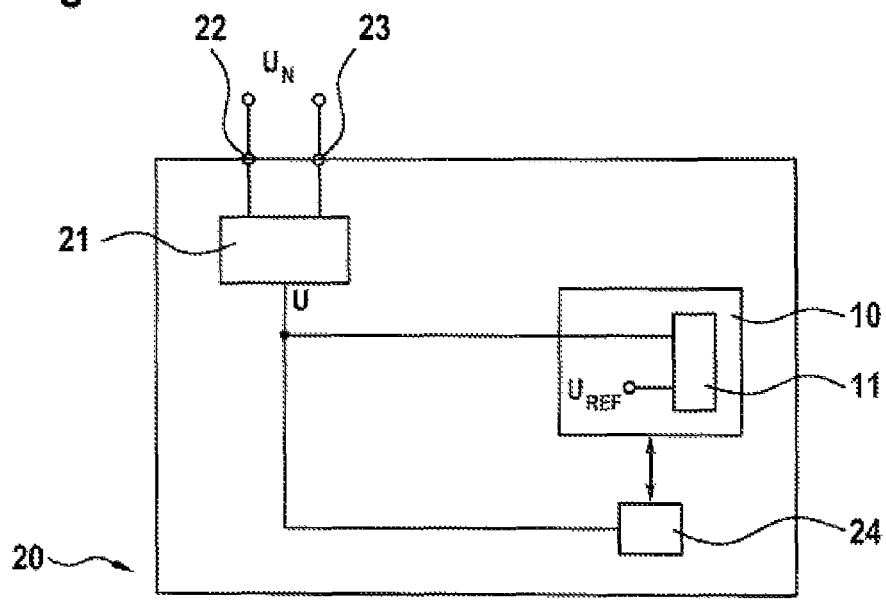
FIG. 1 shows a basic illustration of an embodiment of the electrical apparatus according to the disclosure.

FIG. 1 shows an embodiment of an electrical apparatus 20 according to the disclosure. It can be seen that the electrical apparatus 20 has a first connection 22 and a second connection 23 that can be used to connect the electrical apparatus 20 to an electrical AC voltage $U_N$, for example 110 V or 220 V and 50 Hz or 60 Hz. In addition, the electrical apparatus 20 comprises a power supply unit 21 that transforms the electrical mains voltage $U_N$ into an electrical supply voltage U at a level of 5 V DC voltage, for example. Sometimes, it may be the case that the power supply unit 21 generates variable voltage levels for changing mains conditions, so that disadvantageously there are not always, as desired, constantly 5 V available at the output of the power supply unit 21.

The electrical supply voltage U supplies power to a microcomputer apparatus 10 (e.g. a microcontroller, microprocessor, etc.) and an electronic device 24. By way of example, the electronic device 24 may be in the form of a device for producing a synchronization signal for the electrical apparatus 20. Further assemblies of the electrical apparatus 20, which are likewise supplied with the electrical supply voltage U, are not shown. A drop below a level of the electrical supply voltage U can entail undesirable, undefined operation of the electrical apparatus 20 as a whole on account of a malfunction in the electronic device 24. By way of example, the electrical apparatus 20 may be in the form of electronics for an electric tool, which usually has a large number of peripheral modules.

The disclosure provides for a functional module 11 that is arranged within the microcomputer apparatus 10 to provide an electrical reference voltage $U_{REF}$ that forms a threshold value for the supply voltage U and that matches voltage requirements of the electronic device 24. Continuously, e.g. timed at intervals of clock cycles of the microcomputer apparatus 10, a ratio between the reference voltage $U_{REF}$ and the supply voltage U is ascertained, and in the event that the supply voltage U is below a predefined threshold value $U_S$ a predefined operation is performed by the microcomputer apparatus 10. In this case, by way of example, a defined actuation or control signal can be output to the electronic device 24. As a result, by way of example, the electronic device 24, which is in the form of a device for producing the synchronization signal, can be deactivated, which means that no further synchronization signals are output.

Advantageously, the reference voltage $U_{REF}$ of the microcomputer apparatus 10 is not dependent on a level of the electrical supply voltage U, which means that said reference voltage $U_{REF}$ is always generated essentially without alteration, regardless of all the relevant voltage fluctuations in the electrical supply voltage U that, as mentioned above, may arise on the power supply unit 21.

Preferably, a threshold value $U_S$ for the supply voltage U is stipulated or defined such that, at least if said threshold value $U_S$ of the supply voltage U is observed, all the function groups, including the electronic device 24 of the electrical apparatus 20, still function in a reliable manner and, as a result, trouble-free normal operation of the electrical apparatus 20 is ensured. For this reason, the threshold value $U_S$ is normally stipulated slightly above said function threshold for the electronic device 24, e.g. input by programming into a software program for the microcomputer apparatus 10.

The electrical apparatus 20 in the form of electronics for an electric tool may comprise various peripheral assemblies or elements that ensure reliable functioning of the electric tool.

Said threshold value $U_S$ is thus defined in advance such that all of the existent function groups for the electronics of the electric tool work perfectly, and said reference voltage $U_{REF}$ is set once.

The disclosure can advantageously be used to put the electronics into a safe, defined state (for example a standby state) in the event of a drop in the electrical supply voltage U below the threshold value $U_S$ and thereby to ensure a continuously defined mode of operation of the electric tool. State can preferably be understood to mean a state of a state machine, i.e. a state which is implemented in software and that then deactivates actuation of a motor, for example.

Figure 2:
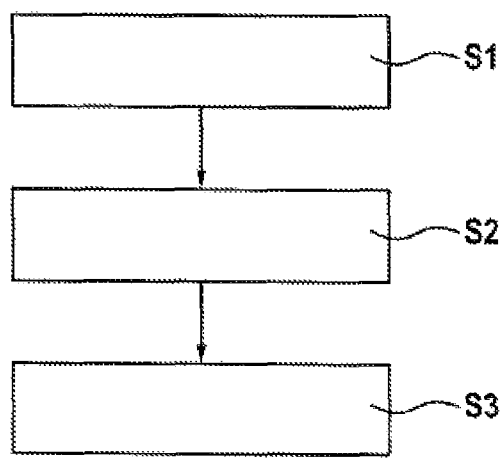
FIG. 2 shows a basic sequence of an embodiment of the method according to the disclosure.

FIG. 2 shows a basic sequence for an embodiment of the method according to the disclosure:

In a first step S1, an electrical reference voltage $U_{REF}$, which is independent of an electrical supply voltage U, is provided.

In a second step S2, continuous comparison of a defined level P of the reference voltage $U_{REF}$ with the electrical supply voltage U is carried out.

In a third step S3, a defined operation is carried out by the microcomputer apparatus 10 for at least one defined ratio between the level P of the reference voltage $U_{REF}$ and the supply voltage U, with a functional module 11 of the microcomputer apparatus 10 being used for performing steps S1 and S2.

Preferably, the method is implemented for the microcomputer apparatus 10 by software, and in this way it is a simple matter to adjust the threshold value $U_S$ of the supply voltage U or level P of the reference voltage $U_{REF}$. Simple modification of the defined operations to be carried out in each case when a defined ratio between the reference voltage $U_{REF}$ and the supply voltage U is reached is therefore possible. Advantageously, when the provided level of the supply voltage U is reached again, it is possible to reset the standby mode to a normal mode of the electrical apparatus 20.

In summary, the present disclosure proposes a method that can be used to put an electric apparatus into a safe defined state when the supply voltage is too low. This advantageously takes place at a time before an unforeseeable functionality of an electronic device prompts erroneous operation of the electrical apparatus. Advantageously, an internal functional module in a microcomputer apparatus can be used for this purpose, which advantageously allows external wiring measures and hence space and cost to be saved. On the basis of an implementation in software, respective associated defined operations of the microcomputer apparatus can be designed very flexibly for certain conditions between a reference voltage $U_{REF}$ and the supply voltage U, said microcomputer apparatus also providing for the electrical apparatuses to be returned to the normal mode, for example.

Although the disclosure has been described using an example of an electric tool, it goes without saying that the disclosure can be used for any types of DC- and AC-powered electrical apparatuses with peripheral electronics.

A person skilled in the art will thus modify and/or combine the features of the disclosure in a suitable manner without departing from the essence of the disclosure.

What is claimed is:

1. A method for operating a microcomputer apparatus, comprising:
    provisioning an electrical reference voltage that is independent of an electrical supply voltage;
    continuously comparing a defined level of the electrical reference voltage with the electrical supply voltage; and
    performing a defined operation with the microcomputer apparatus for at least one defined ratio between the defined level of the electrical reference voltage and the electrical supply voltage,
    wherein the provisioning and the continuous comparing involves using a functional module of the microcomputer apparatus,
    wherein the defined operation is switching an electrical apparatus to a standby state, and
    wherein the microcomputer apparatus is included in the electrical apparatus.

2. The method according to claim 1, wherein the defined operation is performed when the electrical supply voltage is below a defined threshold value.

3. The method according to claim 1, further comprising:
    outputting a control signal to an electronic device.

4. An electrical apparatus comprising:
    a mains power supply; and
    a microcomputer apparatus electrically connected to the mains power supply,
    wherein the electrical apparatus is configured to be switched to a defined state according to an operating method that is carried out by the microcomputer apparatus,
    wherein the operating method includes (i) provisioning an electrical reference voltage that is independent of an electrical supply voltage, (ii) continuously comparing a defined level of the electrical reference voltage with the electrical supply voltage, and (iii) performing a defined operation with the microcomputer apparatus for at least one defined ratio between the defined level of the electrical reference voltage and the electrical supply voltage, and
    wherein the provisioning and the continuous comparing involves using a functional module of the microcomputer apparatus, and
    wherein the defined operation is switching the electrical apparatus to a standby state.

5. The electrical apparatus according to claim 4, further comprising:
    an electronic device associated with the microcomputer apparatus and the mains power supply,
    wherein a threshold value for the electrical supply voltage for the microcomputer apparatus is configured based on a requirement of the electronic device in respect of the mains power supply.

6. The electrical apparatus according to claim 5, wherein the electronic device is configured to produce a synchronization signal.

7. The electrical apparatus according to claim 5, wherein the threshold value and/or the electrical reference voltage is configured to be adjusted in a defined manner.

8. The electrical apparatus according to claim 4, wherein the electrical apparatus is an electric tool.

9. A computer program product comprising:
    a computer-readable storage medium including:
        a plurality of instructions that when executed by a microcomputer apparatus of an electrical apparatus causes the microcomputer apparatus to perform the following acts:
            (i) provisioning an electrical reference voltage that is independent of an electrical supply voltage, (ii) continuously comparing a defined level of the electrical reference voltage with the electrical supply voltage, and (iii) performing a defined operation with the microcomputer apparatus for at least one defined ratio between the defined level of the electrical reference voltage and the electrical supply voltage, and
    wherein the provisioning and the continuous comparing involves using a functional module of the microcomputer apparatus,
    wherein the defined operation is switching the electrical apparatus to a standby state.

* * * * *